United States Patent
Wang et al.

(10) Patent No.: US 12,326,489 B2
(45) Date of Patent: Jun. 10, 2025

(54) PUF-BASED MAGNETOMETER WITH SAFETY PROTECTION CIRCUIT

(71) Applicant: Wenzhou University, Zhejiang (CN)

(72) Inventors: Pengjun Wang, Zhejiang (CN); Xiangyu Li, Zhejiang (CN); Gang Li, Zhejiang (CN); Hao Ye, Zhejiang (CN)

(73) Assignee: Wenzhou University, Zhejiang (CN)

( * ) Notice: Subject to any disclaimer, the term of this patent is extended or adjusted under 35 U.S.C. 154(b) by 161 days.

(21) Appl. No.: 18/463,316

(22) Filed: Sep. 8, 2023

(65) Prior Publication Data

US 2025/0028012 A1 Jan. 23, 2025

(30) Foreign Application Priority Data

Jul. 18, 2023 (CN) .......................... 202310875709.5

(51) Int. Cl.
*G01R 33/09* (2006.01)
*H01L 23/00* (2006.01)
*H10D 84/83* (2025.01)

(52) U.S. Cl.
CPC .......... *G01R 33/098* (2013.01); *H01L 23/576* (2013.01); *H10D 84/83* (2025.01)

(58) Field of Classification Search
CPC .............. G01R 33/098; G01R 33/0023; G01R 33/0094; G01R 33/1215; H01L 23/576; H10D 84/83
See application file for complete search history.

(56) References Cited

U.S. PATENT DOCUMENTS

| | | | |
|---|---|---|---|
| 2016/0093320 A1* | 3/2016 | Aria ..................... | G11B 5/3909 369/53.38 |
| 2021/0063506 A1* | 3/2021 | Wang ................... | G11B 5/3929 |
| 2021/0226772 A1* | 7/2021 | Zalivaka ............... | H04L 9/3242 |
| 2023/0092828 A1* | 3/2023 | Wang ............... | H03K 19/17768 326/8 |
| 2023/0224171 A1* | 7/2023 | Wang ..................... | H04L 9/002 713/189 |

* cited by examiner

*Primary Examiner* — Alvaro E Fortich
(74) *Attorney, Agent, or Firm* — JCIPRNET

(57) ABSTRACT

A PUF-based magnetometer with a safety protection circuit is provided. The PUF-based magnetometer includes a TMR magnetometer main structure, a control circuit, a column encoder circuit, a row encoder circuit, a multiplexer and a dynamic comparator. The TMR magnetometer main structure includes n*n TMR sensors, and the TMR magnetometer main structure can also form a PUF circuit together with a control circuit, a column encoder circuit, a row encoder circuit, a multiplexer and a dynamic comparator to realize a function of a TMR magnetometer. The PUF circuit generates PUF response signals based on random deviations of a TMR sensor fabrication process. The PUF response signals generated by the PUF circuit make it more difficult for attackers to locate specific positions of the TPR sensors, and even make it hard to know the existence of the deviations of the TMR sensors.

3 Claims, 3 Drawing Sheets

PUF-BASED MAGNETOMETER WITH SAFETY PROTECTION CIRCUIT

CROSS-REFERENCE TO RELATED APPLICATION

This application claims the priority benefit of China application serial no. 202310875709.5, filed on Jul. 18, 2023. The entirety of the above-mentioned patent application is hereby incorporated by reference herein and made a part of this specification.

BACKGROUND

Technical Field

The invention relates to a TMR magnetometer, in particular to a PUF-based (physical unclonable function based) magnetometer with a safety protection circuit.

Description of Related Art

With the development of magneto-electronics, magnetoresistance sensors of a multi-layer film structure have witnessed a rapid development from Hall sensors, anisotropic magnetoresistance (AMR) sensors and giant magnetoresistance (GMR) sensors to tunneling magnetic resistance (TMR) sensors. TMR sensors have the advantages of high sensitivity, microminiaturization, low cost and low power, and thus will be a hot issue in competition of microminiature magnetometers in the future.

The TMR sensors, as nerve terminals of IoT systems, can sense desired external data information, and are core components for connecting the digital world and the physical world. With the deepening of IoT application, security issues of the TMR sensors are getting more and more attention. On the one hand, the TMR sensors are often deployed in unattended geographical environments with a little security protection or without security protection, thus having the potential risk of information leakage. On the other hand, due to the fact that the available memory of the accessories of the TMR sensors is small, the calculation capacity of the TMR sensors is limited, and a typical TMR sensor may only have a 512 bytes internal memory, so traditional encryption techniques such as the advanced encryption standard (AES) are not suitable for the TMR sensors. It has become an urgent demand of IoT security to realize secure and confidential transmission of data generated by TMR sensors.

In high-accuracy detection of magnetic fields, a TMR magnetometer may be formed by a TMR sensor and a high-precision readout circuit, and the TMR magnetometer has been widely applied to military and civil IoT fields at present. The TMR magnetometer, as a bottom sensing chip, in IoT application is faced with various security threats such as IP core embezzlement, hardware trojan, reverse engineering and side channel attacks, and has the potential risk of information leakage.

SUMMARY

The technical issue to be solved by the invention is to provide a PUF-based magnetometer with a safety protection circuit, which can resist various security threats such as IP core embezzlement, hardware trojan, reverse engineering and side channel attacks, and has high security.

The technical solution adopted by the invention to solve the above technical issue is as follows: a PUF-based magnetometer with a safety protection circuit comprises a TMR magnetometer main structure, wherein the TMR magnetometer main structure comprises n*n TMR sensors, n is an integer which is greater than or equal to 2, and the n*n TMR sensors are arranged in n rows and n columns to form a TMR sensor array; each TMR sensor has a power terminal, a first control terminal, a second control terminal and an output terminal; when valid signals are input to the first control terminal and the second control terminal of the TMR sensor, the TMR sensor is enabled, and the output terminal of the TRM sensor outputs data; otherwise, the TMR sensor is disabled, and the output terminal of the TRM sensor does not output data; in the TMR sensor array, a working voltage is accessed to the power terminals of the n*n TMR sensors, the first control terminals of the n TMR sensors in the $j^{th}$ row are connected and a connecting terminal is a $j^{th}$ row selection terminal of the TRM sensor array, the second control terminals of the n TMR sensors in the $j^{th}$ column are connected and a connecting terminal is a $j^{th}$ column selection terminal of the TRM sensor array, the output terminals of the n TMR sensors in the $j^{th}$ column are connected and a connecting terminal is a $j^{th}$ output terminal of the TRM sensor array, and j=1, 2, ..., and n; the magnetometer further comprises a control circuit, a column encoder circuit, a column encoder circuit, a multiplexer and a dynamic comparator; the control circuit is used for generating a row selection signal and a column selection signal, and sending the row selection signal to the row encoder circuit and the column selection signal to the column encoder circuit; the row encoder circuit is used for generating and outputting a corresponding row position signal according to the row selection signal, and the row position signal is n-bit binary data comprising two bits of valid data and (n−2) bits of invalid data; the column encoder circuit is used for generating and outputting a corresponding column position signal according to the column selection signal, and the column position signal is n-bit binary data comprising two bits of valid data and (n−2) bits of invalid data; a $j^{th}$ bit of data of the row position signal is input to the $j^{th}$ row selection terminal of the TMR sensor array, and a $j^{th}$ bit of data of the column position signal is input to the $j^{th}$ column selection terminal of the TMR sensor array; when the row position signal and the column position signal are input to the TMR sensor array, the two bits of valid data in the row position signal correspond to two valid rows, the two bits of valid data in the column position signal correspond to two valid columns, the two valid rows are in one-to-one correspondence with the two valid columns, and each valid row and the corresponding valid column form a valid row-column position, such that two valid row-column positions are obtained; at this moment, one bit of valid data, namely a valid signal, is input to each of the first control terminal and the second control terminal of the two TMR sensors at the two valid row-column positions in the TMR sensor array, the two TMR sensors are enabled, the output terminals of the two TMR sensors output data, and the output terminals of the other TMR sensors do not output data; the multiplexer has n input terminals and two output terminals, the n input terminals of the multiplexer are connected to the first output terminal to the $n^{th}$ output terminal of the TMR sensor array in a one-to-one corresponding manner, and the multiplexer is used for correspondingly outputting the data output by the output terminals of the two enabled TMR sensors in the TMR sensor array through the two output terminals; the dynamic comparator has a positive input terminal, a reverse input terminal and an output terminal, the positive input terminal and the reverse input terminal of the dynamic comparator are connected to the two output terminals of the multiplexer in a one-to-one corresponding manner, and the dynamic comparator is used for comparing data input to the positive input terminal and data input to the reverse input terminal to generate a corresponding PUF response signal and outputting the PUF signal through the output terminal;

Each TMR sensor comprises a tunneling magnetic resistor and two electronic switches, wherein each electronic switch has a first connecting terminal, and a second connecting terminal and a control terminal; when a valid signal is input to the control terminal of the electronic switch, the first connecting terminal and the second connecting terminal of the electronic switch are connected; otherwise, the first connecting terminal and the second connecting terminal of the electronic switch are disconnected; the two electronic switches are referred to as a first electronic switch and a second electronic switch respectively, the first connecting terminal of the first electronic switch is the power terminal of the TMR sensor, the second connecting terminal of the first electronic switch is connected to one terminal of the tunneling magnetic resistor, the other terminal of the tunneling magnetic resistor is connected to the first connecting terminal of the second electronic switch, the second connecting terminal of the second electronic switch is the output terminal of the TMR sensor, the control terminal of the first electronic switch is the first control terminal of the TMR sensor, and the control terminal of the second electronic switch is the second control terminal of the TMR sensor.

The dynamic comparator comprises a first MOS transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor, a fifteenth MOS transistor, a sixteenth MOS transistor, a seventeenth MOS transistor, an eighteenth MOS transistor, a nineteenth MOS transistor, a twentieth MOS transistor, a twenty-first MOS transistor, a twenty-second MOS transistor, a twenty-third MOS transistor, a twenty-fourth MOS transistor, a twenty-fifth MOS transistor, a twenty-sixth MOS transistor and a twenty-seventh MOS transistor, wherein the first MOS transistor, the second MOS transistor, the third MOS transistor, the fourth MOS transistor, the fourteenth MOS transistor, the fifteenth MOS transistor, the sixteenth MOS transistor, the seventeenth MOS transistor, the eighteenth MOS transistor, the nineteenth MOS transistor, the twentieth MOS transistor, the twenty-first MOS transistor, the twenty-second MOS transistor and the twenty-third MOS transistor are all PMOS transistors, and the fifth MOS transistor, the sixth MOS transistor, the seventh MOS transistor, the eighth MOS transistor, the ninth MOS transistor, the tenth MOS transistor, the eleventh MOS transistor, the twelfth MOS transistor, the thirteenth MOS transistor, the twenty-fourth MOS transistor, the twenty-fifth MOS transistor, the twenty-sixth MOS transistor and the twenty-seventh MOS transistor are all NMOS transistors; a supply voltage is accessed to a source of the fourteenth MOS transistor, a source of the fifteenth MOS transistor, a source of the sixteenth MOS transistor, a source of the seventeenth MOS transistor, a source of the eighteenth MOS transistor, a source of the nineteenth MOS transistor, a source of the twentieth MOS transistor, a source of the twenty-first MOS transistor, a source of the twenty-second MOS transistor and a source of the twenty-third MOS transistor, a source of the first MOS transistor, a source of the second MOS transistor and a drain of the nineteenth MOS transistor are connected, a drain of the first MOS transistor and a source of the third MOS transistor are connected, a drain of the second MOS transistor and a source of the fourth MOS transistor are connected, a gate of the first MOS transistor and a gate of the third MOS transistor are connected and a connecting terminal is the positive input terminal of the dynamic comparator, a gate of the second MOS transistor and a gate of the fourth MOS transistor are connected and a connecting terminal is the reverse input terminal of the dynamic comparator, a drain of the third MOS transistor, a drain of the fifth MOS transistor, a gate of the fifth MOS transistor and a gate of the seventh MOS transistor are connected, a drain of the fourth MOS transistor and a drain of the sixth MOS transistor are connected, a gate of the sixth MOS transistor and a gate of the eighth MOS transistor are connected, a source of the fifth MOS transistor, a source of the sixth MOS transistor, a source of the seventh MOS transistor, a source of the eighteenth MOS transistor, a source of the ninth MOS transistor, a source of the tenth MOS transistor, a drain of the eighteenth MOS transistor, a gate of the nineteenth MOS transistor, a source of the twenty-fifth MOS transistor and a source of the twenty-seventh MOS transistor are all grounded, a drain of the seventh MOS transistor, a drain of the ninth MOS transistor, a drain of the eleventh MOS transistor, a drain of the twelfth MOS transistor and a gate of the tenth MOS transistor are connected, a drain of the eighth MOS transistor, a gate of the ninth MOS transistor, a drain of the tenth MOS transistor, a source of the eleventh MOS transistor and a source of the thirteenth MOS transistor are connected, a second clock signal is input to a gate of the eleventh MOS transistor, a first clock signal is input to a gate of the twelfth MOS transistor, a gate of the thirteenth MOS transistor, a gate of the fourteenth MOS transistor and a gate of the seventeenth MOS transistor, the first clock signal and the second clock signal are identical in amplitude and opposite in phase; a drain of the twelfth MOS transistor, a drain of the fourteenth MOS transistor, a drain of the fifteenth MOS transistor, a gate of the sixteenth MOS transistor, a gate of the twenty-third MOS transistor and a gate of the twenty-seventh MOS transistor are connected, a drain of the thirteenth MOS transistor, a gate of the fifteenth MOS transistor, a drain of the sixteenth MOS transistor, a drain of the seventeenth MOS transistor, a gate of the twenty-first MOS transistor and a gate of the twenty-fifth MOS transistor are connected, a gate of the twentieth MOS transistor and a gate of the twenty-fourth MOS transistor are connected, a drain of the twentieth MOS transistor, a drain of the twenty-first MOS transistor and a drain of the twenty-fourth MOS transistor are connected, a gate of the twenty-second MOS transistor and a gate of twenty-sixth MOS transistor are connected and a connecting terminal is the output terminal of the dynamic comparator, a drain of the twenty-second MOS transistor, a drain of the twenty-third MOS transistor and a drain of the twenty-sixth MOS transistor are connected, a source of the twenty-fourth MOS transistor and a drain of the twenty-fifth MOS transistor are connected, and a source of the twenty-sixth MOS transistor and a drain of the twenty-seventh MOS transistor are connected.

Compared with the prior art, the invention has the following advantages: the control circuit, the column encoder circuit, the row encoder circuit, the multiplexer and the dynamic comparator are added to the existing TMR magnetometer main structure, the control circuit generates a row selection signal and a column selection signal, and sends the row selection signal to the row encoder circuit and the column selection signal to the column encoder circuit, the row encoder circuit generates and outputs a corresponding row position signal according to the row selection signal, the row position signal is n-bit binary data comprising two bits of valid data and (n−2) bits of invalid data, the column encoder circuit generates and outputs a corresponding column position signal according to the column selection signal, the column position signal is n-bit binary data comprising two bits of valid data and (n−2) bits of invalid data, a $j^{th}$ bit of data of the row position signal is input to a $j^{th}$ row selection terminal of the TMR sensor array, and a $j^{th}$ bit of data of the column position signal is input to a $j^{th}$ column selection terminal of the TMR sensor array; when the row position signal and the column position signal are input to the TMR sensor array, the two bits of valid data in the row position signal correspond to two valid rows, the two bits of valid data in the column position signal correspond to two valid columns, the two valid rows are in one-to-one correspondence with the two valid columns, and each valid row and the corresponding valid column form a valid row-column position, such that two valid row-column positions are obtained; at this moment, one bit of valid data, namely a valid signal, is input to each of a first control terminal and a second control terminal of two TMR sensors at the two valid row-column positions in the TMR sensor array, the two TMR sensors are enabled, output terminals of the two TMR sensors output data, output terminals of the other TMR sensors do not output data, the multiplexer correspondingly outputs the data output by the output terminals of the two enabled TMR sensors in the TMR sensor array through two output terminals, and the dynamic comparator compares two pieces of data input thereto, generates a corresponding PUF response signal, and outputs the PUF response signal through an output terminal, such that the TMR magnetometer main structure not only can function as a TMR magnetometer, but also can form a PUF circuit together with the control circuit, the column encoder circuit, the row encoder circuit, the multiplexer and the dynamic comparator, the PUF circuit generates PUF response signals based on random deviations of the TMR sensor fabrication process, the PUF response signals generated by the PUF circuit make it more difficult for attackers to locate the specific positions of the TPR sensors and even make it hard to know the existence of the deviations of the TMR sensors, and thus, the magnetometer has the ability to resist attacks in the defense mode, can resist various security threats such as IP core embezzlement, hardware trojan, reverse engineering and side channel attacks, is less likely to be attacked, and has high security.

DESCRIPTION OF THE EMBODIMENTS

The invention will be described in further detail below in conjunction with the accompanying drawings.

Figure 1:
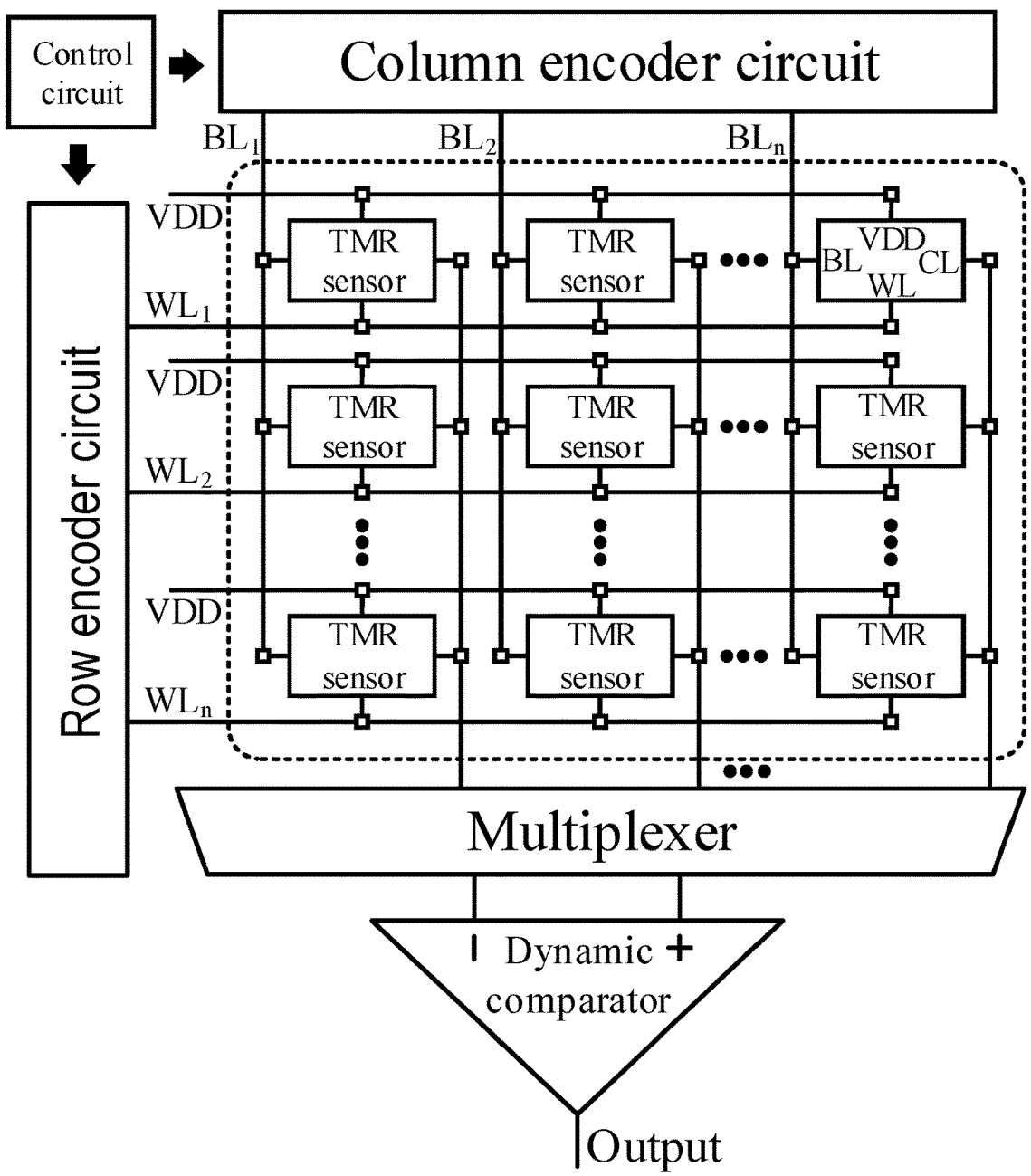
FIG. 1 is a structural diagram of a PUF-based magnetometer with a safety protection circuit according to the invention.

Embodiment 1: As shown in FIG. 1, a PUF-based magnetometer with a safety protection circuit comprises a TMR magnetometer main structure, wherein the TMR magnetometer main structure comprises n*n TMR sensors, n is an integer which is greater than or equal to 2, and the n*n TMR sensors are arranged in n rows and n columns to form a TMR sensor array; each TMR sensor has a power terminal, a first control terminal, a second control terminal and an output terminal; when valid signals are input to the first control terminal and the second control terminal of the TMR sensor, the TMR sensor is enabled, and the output terminal of the TRM sensor outputs data; otherwise, the TMR sensor is disabled, and the output terminal of the TRM sensor does not output data; in the TMR sensor array, a working voltage is accessed to the power terminals of the n*n TMR sensors, the first control terminals of the n TMR sensors in the $j^{th}$ row are connected and a connecting terminal is a $j^{th}$ row selection terminal of the TRM sensor array, the second control terminals of the n TMR sensors in the $j^{th}$ column are connected and a connecting terminal is a $j^{th}$ column selection terminal of the TRM sensor array, the output terminals of the n TMR sensors in the $j^{th}$ column are connected and a connecting terminal is a $j^{th}$ output terminal of the TRM sensor array, and $j=1, 2, \ldots,$ and n; the magnetometer further comprises a control circuit, a column encoder circuit, a column encoder circuit, a multiplexer and a dynamic comparator; the control circuit is used for generating a row selection signal and a column selection signal, and sending the row selection signal to the row encoder circuit and the column selection signal to the column encoder circuit; the row encoder circuit is used for generating and outputting a corresponding row position signal according to the row selection signal, and the row position signal is n-bit binary data comprising two bits of valid data and (n−2) bits of invalid data; the column encoder circuit is used for generating and outputting a corresponding column position signal according to the column selection signal, and the column position signal is n-bit binary data comprising two bits of valid data and (n−2) bits of invalid data; a $j^{th}$ bit of data of the row position signal is input to the $j^{th}$ row selection terminal of the TMR sensor array, and a $j^{th}$ bit of data of the column position signal is input to the $j^{th}$ column selection terminal of the TMR sensor array; when the row position signal and the column position signal are input to the TMR sensor array, the two bits of valid data in the row position signal correspond to two valid rows, the two bits of valid data in the column position signal correspond to two valid columns, the two valid rows are in one-to-one correspondence with the two valid columns, and each valid row and the corresponding valid column form a valid row-column position, such that two valid row-column positions are obtained; at this moment, one bit of valid data, namely a valid signal, is input to each of the first control terminal and the second control terminal of the two TMR sensors at the two valid row-column positions in the TMR sensor array, the two TMR sensors are enabled, the output terminals of the two TMR sensors output data, and the output terminals of the other TMR sensors do not output data; the multiplexer has n input terminals and two output terminals, the n input terminals of the multiplexer are connected to the first output terminal to the $n^{th}$ output terminal of the TMR sensor array in a one-to-one corresponding manner, and the multiplexer is used for correspondingly outputting the data output by the output terminals of the two enabled TMR sensors in the TMR sensor array through the two output terminals; and the dynamic comparator has a positive input terminal, a reverse input terminal and an output terminal, the positive input terminal and the reverse input terminal of the dynamic comparator are connected to the two output terminals of the multiplexer in a one-to-one corresponding manner, and the dynamic comparator is used for comparing data input to the positive input terminal and data input to the reverse input terminal to generate a corresponding PUF response signal and outputting the PUF signal through the output terminal.

Figure 2:
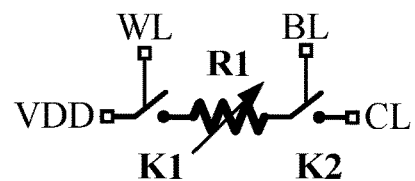
FIG. 2 is a circuit diagram of a TMR sensor of the PUF-based magnetometer with a safety protection circuit according to the invention.

Embodiment 2: This embodiment is basically identical with Embodiment 1, and it differs from Embodiment 1 in the following aspects: in this embodiment, as shown in FIG. 2, each TMR sensor comprises a tunneling magnetic resistor R1 and two electronic switches, wherein each electronic switch has a first connecting terminal, and a second connecting terminal and a control terminal; when a valid signal is input to the control terminal of the electronic switch, the first connecting terminal and the second connecting terminal of the electronic switch are connected; otherwise, the first connecting terminal and the second connecting terminal of the electronic switch are disconnected; the two electronic switches are referred to as a first electronic switch K1 and a second electronic switch K2 respectively, the first connecting terminal of the first electronic switch K1 is the power terminal of the TMR sensor, the second connecting terminal of the first electronic switch K1 is connected to one terminal of the tunneling magnetic resistor R1, the other terminal of the tunneling magnetic resistor R1 is connected to the first connecting terminal of the second electronic switch K2, the second connecting terminal of the second electronic switch K2 is the output terminal of the TMR sensor, the control terminal of the first electronic switch K1 is the first control terminal of the TMR sensor, and the control terminal of the second electronic switch K2 is the second control terminal of the TMR sensor.

Figure 3:
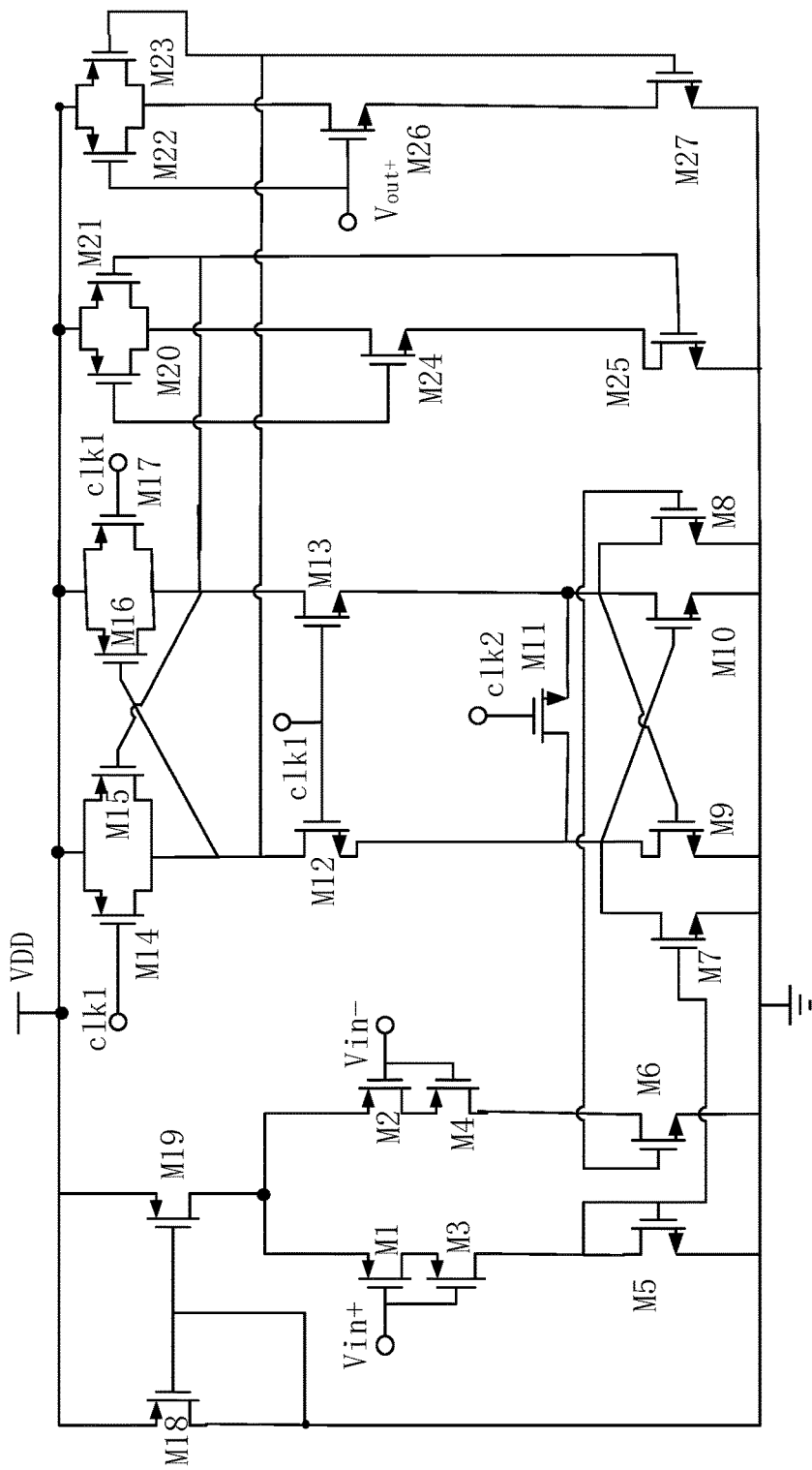
FIG. 3 is a circuit diagram of a dynamic comparator of the PUF-based magnetometer with a safety protection circuit according to the invention.
Figure 4:
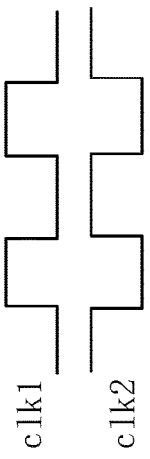
FIG. 4 is an oscillogram of a first clock signal and a second clock signal input to the PUF-based magnetometer with a safety protection circuit according to the invention.

Embodiment 3: This embodiment is basically identical with Embodiment 1, and it differs from Embodiment 1 in the following aspects: in this embodiment, as shown in FIG. 3, the dynamic comparator comprises a first MOS transistor M1, a second MOS transistor M2, a third MOS transistor M3, a fourth MOS transistor M4, a fifth MOS transistor M5, a sixth MOS transistor M6, a seventh MOS transistor M7, an eighth MOS transistor M8, a ninth MOS transistor M9, a tenth MOS transistor M10, an eleventh MOS transistor M11, a twelfth MOS transistor M12, a thirteenth MOS transistor M13, a fourteenth MOS transistor M14, a fifteenth MOS transistor M15, a sixteenth MOS transistor M16, a seventeenth MOS transistor M17, an eighteenth MOS transistor M18, a nineteenth MOS transistor M19, a twentieth MOS transistor M20, a twenty-first MOS transistor M21, a twenty-second MOS transistor M22, a twenty-third MOS transistor M23, a twenty-fourth MOS transistor M24, a twenty-fifth MOS transistor M25, a twenty-sixth MOS transistor M26 and a twenty-seventh MOS transistor M27, wherein the first MOS transistor M1, the second MOS transistor M2, the third MOS transistor M3, the fourth MOS transistor M4, the fourteenth MOS transistor M14, the fifteenth MOS transistor M15, the sixteenth MOS transistor M16, the seventeenth MOS transistor M17, the eighteenth MOS transistor M18, the nineteenth MOS transistor M19, the twentieth MOS transistor M20, the twenty-first MOS transistor M21, the twenty-second MOS transistor M22 and the twenty-third MOS transistor M23 are all PMOS transistors, and the fifth MOS transistor M5, the sixth MOS transistor M6, the seventh MOS transistor M7, the eighth MOS transistor M8, the ninth MOS transistor M9, the tenth MOS transistor M10, the eleventh MOS transistor M11, the twelfth MOS transistor M12, the thirteenth MOS transistor M13, the twenty-fourth MOS transistor M24, the twenty-fifth MOS transistor M25, the twenty-sixth MOS transistor M26 and the twenty-seventh MOS transistor M27 are all NMOS transistors; a supply voltage is accessed to a source of the fourteenth MOS transistor M14, a source of the fifteenth MOS transistor M15, a source of the sixteenth MOS transistor M16, a source of the seventeenth MOS transistor M17, a source of the eighteenth MOS transistor M18, a source of the nineteenth MOS transistor M19, a source of the twentieth MOS transistor M20, a source of the twenty-first MOS transistor M21, a source of the twenty-second MOS transistor M2 and a source of the twenty-third MOS transistor M23, a source of the first MOS transistor M1, a source of the second MOS transistor M2 and a drain of the nineteenth MOS transistor M19 are connected, a drain of the first MOS transistor M1 and a source of the third MOS transistor M3 are connected, a drain of the second MOS transistor M2 and a source of the fourth MOS transistor M4 are connected, a gate of the first MOS transistor M1 and a gate of the third MOS transistor M3 are connected and a connecting terminal is the positive input terminal of the dynamic comparator, a gate of the second MOS transistor M2 and a gate of the fourth MOS transistor M4 are connected and a connecting terminal is the reverse input terminal of the dynamic comparator, a drain of the third MOS transistor M3, a drain of the fifth MOS transistor M5, a gate of the fifth MOS transistor M5 and a gate of the seventh MOS transistor M7 are connected, a drain of the fourth MOS transistor M4 and a drain of the sixth MOS transistor M6 are connected, a gate of the sixth MOS transistor M6 and a gate of the eighth MOS transistor M8 are connected, a source of the fifth MOS transistor M5, a source of the sixth MOS transistor M6, a source of the seventh MOS transistor M7, a source of the eighteenth MOS transistor M8, a source of the ninth MOS transistor M9, a source of the tenth MOS transistor M10, a drain of the eighteenth MOS transistor M18, a gate of the nineteenth MOS transistor M19, a source of the twenty-fifth MOS transistor M25 and a source of the twenty-seventh MOS transistor M27 are all grounded, a drain of the seventh MOS transistor M7, a drain of the ninth MOS transistor M9, a drain of the eleventh MOS transistor M11, a drain of the twelfth MOS transistor M12 and a gate of the tenth MOS transistor M10 are connected, a drain of the eighth MOS transistor M8, a gate of the ninth MOS transistor M9, a drain of the tenth MOS transistor M10, a source of the eleventh MOS transistor M11 and a source of the thirteenth MOS transistor M13 are connected, a second clock signal clk2 is input to a gate of the eleventh MOS transistor M11, a first clock signal clk1 is input to a gate of the twelfth MOS transistor M12, a gate of the thirteenth MOS transistor M13, a gate of the fourteenth MOS transistor M14 and a gate of the seventeenth MOS transistor M17, the first clock signal clk1 and the second clock signal clk2 are identical in amplitude and opposite in phase; a drain of the twelfth MOS transistor M12, a drain of the fourteenth MOS transistor M14, a drain of the fifteenth MOS transistor M15, a gate of the sixteenth MOS transistor M16, a gate of the twenty-third MOS transistor M23 and a gate of the twenty-seventh MOS transistor M27 are connected, a drain of the thirteenth MOS transistor M13, a gate of the fifteenth MOS transistor M15, a drain of the sixteenth MOS transistor M16, a drain of the seventeenth MOS transistor M17, a gate of the twenty-first MOS transistor M21 and a gate of the twenty-fifth MOS transistor M25 are connected, a gate of the twentieth MOS transistor M20 and a gate of the twenty-fourth MOS transistor M24 are connected, a drain of the twentieth MOS M20 transistor, a drain of the twenty-first MOS transistor M21 and a drain of the twenty-fourth MOS transistor M24 are connected, a gate of the twenty-second MOS transistor M22 and a gate of twenty-sixth MOS transistor M26 are connected and a connecting terminal is the output terminal of the dynamic comparator, a drain of the twenty-second MOS transistor M22, a drain of the twenty-third MOS transistor M23 and a drain of the twenty-sixth MOS transistor M26 are connected, a source of the twenty-fourth MOS transistor M24 and a drain of the twenty-fifth MOS transistor M25 are connected, and a source of the twenty-sixth MOS transistor M26 and a drain of the twenty-seventh MOS transistor M27 are connected.

In this embodiment, the first MOS transistor M1, the second MOS transistor M2, the third MOS transistor M3, the fourth MOS transistor M4, the fifth MOS transistor M5, the sixth MOS transistor M6, the seventh MOS transistor M7, the eighth MOS transistor M8, the ninth MOS transistor M9, the tenth MOS transistor M10, the eleventh MOS transistor M11, the twelfth MOS transistor M12, the thirteenth MOS transistor M13, the fourteenth MOS transistor M14, the fifteenth MOS transistor M15, the sixteenth MOS transistor M16, the seventeenth MOS transistor M17, the eighteenth MOS transistor M18 and the nineteenth MOS transistor M19 form a one-bit quantization comparator, the twentieth MOS transistor M20, the twenty-first MOS transistor M21, the twenty-second MOS transistor M22, the twenty-third MOS transistor M23, the twenty-fourth MOS transistor M24, the twenty-fifth MOS transistor M25, the twenty-sixth MOS transistor M26 and the twenty-seventh MOS transistor M27 form an RS latch, the eighteenth MOS transistor M18 and the nineteenth MOS transistor M19 form a current mirror to provide a current for the input terminal of the dynamic comparator, and the fourteenth MOS transistor M14, the seventeenth MOS transistor M17, the twelfth MOS transistor M12, the thirteenth MOS transistor M13 and the eleventh MOS transistor M11 are controlled by the first clock signal clk1 and the second clock signal clk2 to be turned on or off to control the dynamic comparator to perform a comparison operation and hold an operation result; when the first clock signal clk1 is a high level and the second clock signal clk2 are low levels, the fourteenth MOS transistor M14, the seventeenth MOS transistor M17, the twelfth MOS transistor M12 and the thirteenth MOS transistor M13 are turned on, the eleventh MOS transistor M11 is turned off, the dynamic comparator compares signals input to the positive input terminal and the reverse input terminal, and the seventh MOS transistor M7 and the eighth MOS transistor M8 are used as a positive feedback path, such that the comparison speed is increased; when the first clock signal clk1 turns into a low level and the second clock signal clk2 turns into a high level, the one-bit quantization comparator stops working and latches the previous operation result, and the RS latch connected to the one-bit quantization comparator latches an input signal and feeds the input signal to the one-bit quantization comparator through the seventh MOS transistor M7 and the eighth MOS transistor M8, as a pre-feedback signal; in the design process, in order to save static power, the size of the eighteenth MOS transistor M18 is set to be small, and the width-to-length ratio is 1 or 2, such that the static current provided by the eighteenth MOS transistor M18 is relatively small; with the increase of the size of the first MOS transistor M1 and the second MOS transistor M2, the transconductance will increase, the magnification factor of an input voltage will be higher, and the voltage resolution of the dynamic comparator will be higher, so the width-to-length ratio of the first MOS transistor M1 and the second MOS transistor M2 is generally set to be greater than 100; the charge injection and the clock feed-through effect generated when the fourteenth MOS transistor M14, the seventeenth MOS transistor M17, the twelfth MOS transistor M12, the thirteenth MOS transistor M13 and the eleventh MOS transistor M11 are turned on or off will impact the comparison accuracy of the dynamic comparator, and in order to reduce the impact on the comparison accuracy of the dynamic comparator, the size of the fourteenth MOS transistor M14, the seventeenth MOS transistor M17, the twelfth MOS transistor M12, the thirteenth MOS transistor M13 and the eleventh MOS transistor M11 is set to be small, the width-to-length ratio is 2 or 1, and the third MOS transistor M13 and the fourth MOS transistor are used as virtual transistors and connected in parallel to reduce the charge injection and the clock feed-through effect, which not only can improve the small signal resolution of the dynamic comparator and the accuracy of the dynamic comparator, but also can obtain a higher comparison speed, making the time response of the dynamic comparator good; and in a case where two voltage signals to be compared by the dynamic comparator (signals input to the positive input terminal and the reverse input terminal of the dynamic comparator) are close, the dynamic comparator can still compare the two voltage signals accurately in a short time.

Figure 5:
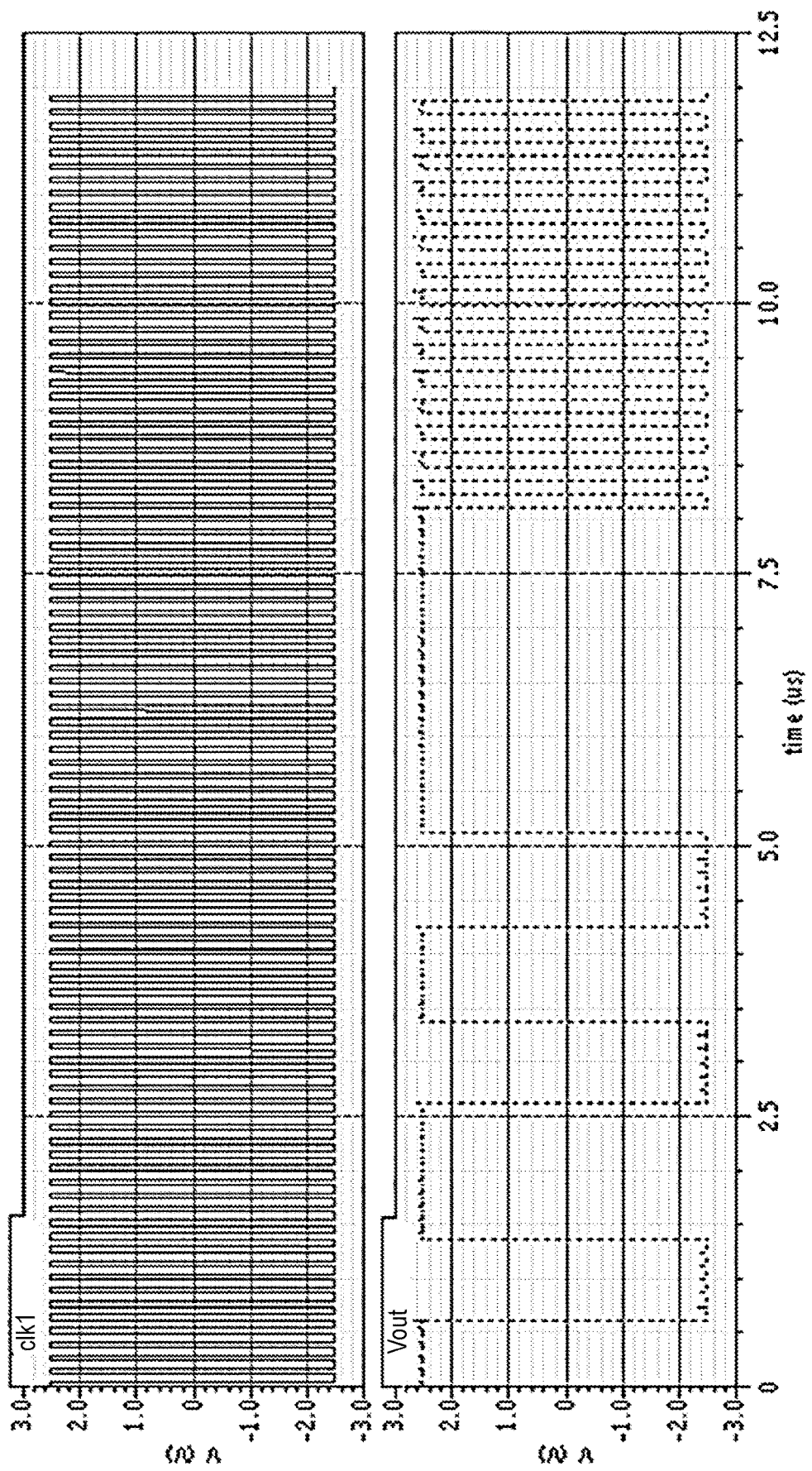
FIG. 5 is a functional simulation diagram of the dynamic comparator of the PUF-based magnetometer with a safety protection circuit according to the invention.

To verify the performance of the PUF-based magnetometer with a safety protection circuit provided by the invention, functional simulation is performed on the PUF-based magnetometer with a safety protection circuit provided by the invention, and the functional simulation diagram is shown in FIG. 5. In FIG. 5, the waveform of the first clock signal clk1 is shown in the upper portion, and the output waveform of the one-bit quantization comparator is shown in the lower portion. During simulation, the amplitude of the first clock signal clk1 is 2.5 V, the frequency is 2.5 MHz, and the duty cycle is 0.5; a signal Vin+ input to the positive input terminal of the dynamic comparator is a sinusoidal signal with an amplitude of 1 mV and a frequency of 100 kHz, and a signal Vin- input to the reverse input terminal is 0 V. It can be known, by analyzing FIG. 5, that when the first clock signal clk1 is a high level, the one-bit quantization comparator starts to compare the input signals Vin+ and Vin−; when the first clock signal clk1 turns into a low level, the one-bit quantization comparator latches the previous comparison result. As can be known, from the above analysis and transient simulation, when the frequency of the first clock signal clk1 is 2.5 MHz, the resolution of the one-bit quantization comparator is higher than 1 mV, and the delay of the one-bit quantization comparator is 1.7 ns. Results indicate that the resolution of the one-bit quantization comparator is less than 1 mV, and the delay of the one-bit quantization comparator is about 1.7 ns. Therefore, the dynamic comparator of the invention has high accuracy and faster comparison speed.

What is claimed is:

1. A PUF-based magnetometer with a safety protection circuit, comprising:
   a TMR magnetometer main structure, wherein the TMR magnetometer main structure comprises n*n TMR sensors, n is an integer greater than or equal to 2, and the n*n TMR sensors are arranged in n rows and n columns to form a TMR sensor array;
   wherein each TMR sensor of the n*n TMR sensors has a power terminal, a first control terminal, a second control terminal and an output terminal; wherein when valid signals are input to the first control terminal and the second control terminal of a TMR sensor of the n*n TMR sensors, the TMR sensor is enabled, and the output terminal of the TRM sensor outputs data; otherwise, the TMR sensor is disabled, and the output terminal of the TRM sensor does not output data;

in the TMR sensor array, a working voltage is accessed to the power terminals of the n*n TMR sensors, first control terminals of n TMR sensors in a jth row are connected and a connecting terminal is a jth row selection terminal of the TRM sensor array, wherein second control terminals n TMR sensors in a jth column are connected and a connecting terminal is a jth column selection terminal of the TRM sensor array, output terminals of the n TMR sensors in the jth column are connected and a connecting terminal is a jth output terminal of the TRM sensor array, and j=1, 2, . . . , and n;

wherein the PUF-based magnetometer further comprises:
a control circuit, configured to generate a row selection signal and a column selection signal, and configured to send the row selection signal to a row encoder circuit and the column selection signal to a column encoder circuit;

the row encoder circuit, configured to generate and output a corresponding row position signal according to the row selection signal, wherein the row position signal is n-bit binary data comprising two bits of valid data and (n−2) bits of invalid data;

the column encoder circuit, configured to generate and output a corresponding column position signal according to the column selection signal, wherein the column position signal is n-bit binary data comprising two bits of valid data and (n−2) bits of invalid data; wherein a jth bit of data of the row position signal is input to the jth row selection terminal of the TMR sensor array, and a jth bit of data of the column position signal is input to the jth column selection terminal of the TMR sensor array; wherein when the row position signal and the column position signal are input to the TMR sensor array, the two bits of valid data in the row position signal correspond to two valid rows, the two bits of valid data in the column position signal correspond to two valid columns, wherein the two valid rows are in one-to-one correspondence with the two valid columns, and each valid row and the corresponding valid column form a valid row-column position, such that two valid row-column positions are obtained; at this moment, one bit of valid data, namely a valid signal, is input to each of the first control terminal and the second control terminal of two TMR sensors of the n*n TMR sensors at the two valid row-column positions in the TMR sensor array, the two TMR sensors are enabled, the output terminals of the two TMR sensors output data, and the output terminals of the other TMR sensors do not output data;

a multiplexer, having n input terminals and two output terminals, wherein then input terminals of the multiplexer are connected to the first output terminal to the nth output terminal of the TMR sensor array in a one-to-one corresponding manner, and the multiplexer is configured to correspondingly output data output by the output terminals of the two enabled TMR sensors in the TMR sensor array through the two output terminals; and a dynamic comparator, having a positive input terminal, a reverse input terminal and an output terminal, wherein the positive input terminal and the reverse input terminal of the dynamic comparator are connected to the two output terminals of the multiplexer in a one-to-one corresponding manner, and the dynamic comparator is configured to compare data input to the positive input terminal and data input to the reverse input terminal to generate a corresponding PUF response signal and output the PUF signal through the output terminal.

2. The PUF-based magnetometer with the safety protection circuit according to claim 1, wherein each TMR sensor of the n*n TMR sensors comprises a tunneling magnetic resistor and two electronic switches, wherein each electronic switch of the two electronic switches has a first connecting terminal, a second connecting terminal and a control terminal;

wherein when a valid signal is input to the control terminal of an electronic switch of the two electronic switches, the first connecting terminal and the second connecting terminal of the electronic switch are connected; otherwise, the first connecting terminal and the second connecting terminal of the electronic switch are disconnected;

wherein the two electronic switches are respectively defined as a first electronic switch and a second electronic switch, wherein the first connecting terminal of the first electronic switch is the power terminal of the TMR sensor, and the second connecting terminal of the first electronic switch is connected to one terminal of the tunneling magnetic resistor, the other terminal of the tunneling magnetic resistor is connected to the first connecting terminal of the second electronic switch, wherein the second connecting terminal of the second electronic switch is the output terminal of the TMR sensor, the control terminal of the first electronic switch is the first control terminal of the TMR sensor, and the control terminal of the second electronic switch is the second control terminal of the TMR sensor.

3. The PUF-based magnetometer with the safety protection circuit according to claim 1, wherein the dynamic comparator comprises a first MOS transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor, a fifteenth MOS transistor, a sixteenth MOS transistor, a seventeenth MOS transistor, an eighteenth MOS transistor, a nineteenth MOS transistor, a twentieth MOS transistor, a twenty-first MOS transistor, a twenty-second MOS transistor, a twenty-third MOS transistor, a twenty-fourth MOS transistor, a twenty-fifth MOS transistor, a twenty-sixth MOS transistor and a twenty-seventh MOS transistor, wherein the first MOS transistor, the second MOS transistor, the third MOS transistor, the fourth MOS transistor, the fourteenth MOS transistor, the fifteenth MOS transistor, the sixteenth MOS transistor, the seventeenth MOS transistor, the eighteenth MOS transistor, the nineteenth MOS transistor, the twentieth MOS transistor, the twenty-first MOS transistor, the twenty-second MOS transistor and the twenty-third MOS transistor are all PMOS transistors, and the fifth MOS transistor, the sixth MOS transistor, the seventh MOS transistor, the eighth MOS transistor, the ninth MOS transistor, the tenth MOS transistor, the eleventh MOS transistor, the twelfth MOS transistor, the thirteenth MOS transistor, the twenty-fourth MOS transistor, the twenty-fifth MOS transistor, the twenty-sixth MOS transistor and the twenty-seventh MOS transistor are all NMOS transistors;

wherein a supply voltage is provided to a source of the fourteenth MOS transistor, a source of the fifteenth MOS transistor, a source of the sixteenth MOS transistor, a source of the seventeenth MOS transistor, a source of the eighteenth MOS transistor, a source of the nineteenth MOS transistor, a source of the twentieth MOS transistor, a source of the twenty-first MOS transistor, a source of the twenty-second MOS transistor and a source of the twenty-third MOS transistor, wherein a source of the first MOS transistor, a source of the second MOS transistor and a drain of the nineteenth MOS transistor are connected, a drain of the first MOS transistor and a source of the third MOS transistor are connected, a drain of the second MOS transistor and a source of the fourth MOS transistor are connected, wherein a gate of the first MOS transistor and a gate of the third MOS transistor are connected to a connecting terminal which is the positive input terminal of the dynamic comparator, and a gate of the second MOS transistor and a gate of the fourth MOS transistor are connected a connecting terminal which is the reverse input terminal of the dynamic comparator, wherein a drain of the third MOS transistor, a drain of the fifth MOS transistor, a gate of the fifth MOS transistor and a gate of the seventh MOS transistor are connected, a drain of the fourth MOS transistor and a drain of the sixth MOS transistor are connected, a gate of the sixth MOS transistor and a gate of the eighth MOS transistor are connected, a source of the fifth MOS transistor, a source of the sixth MOS transistor, a source of the seventh MOS transistor, a source of the eighteenth MOS transistor, a source of the ninth MOS transistor, a source of the tenth MOS transistor, a drain of the eighteenth MOS transistor, a gate of the nineteenth MOS transistor, a source of the twenty-fifth MOS transistor and a source of the twenty-seventh MOS transistor are all grounded, a drain of the seventh MOS transistor, a drain of the ninth MOS transistor, a drain of the eleventh MOS transistor, a drain of the twelfth MOS transistor and a gate of the tenth MOS transistor are connected, a drain of the eighth MOS transistor, a gate of the ninth MOS transistor, a drain of the tenth MOS transistor, a source of the eleventh MOS transistor and a source of the thirteenth MOS transistor are connected, a second clock signal is input to a gate of the eleventh MOS transistor, a first clock signal is input to a gate of the twelfth MOS transistor, a gate of the thirteenth MOS transistor, a gate of the fourteenth MOS transistor and a gate of the seventeenth MOS transistor, the first clock signal and the second clock signal are identical in amplitude and opposite in phase; a drain of the twelfth MOS transistor, a drain of the fourteenth MOS transistor, a drain of the fifteenth MOS transistor, a gate of the sixteenth MOS transistor, a gate of the twenty-third MOS transistor and a gate of the twenty-seventh MOS transistor are connected, a drain of the thirteenth MOS transistor, a gate of the fifteenth MOS transistor, a drain of the sixteenth MOS transistor, a drain of the seventeenth MOS transistor, a gate of the twenty-first MOS transistor and a gate of the twenty-fifth MOS transistor are connected, a gate of the twentieth MOS transistor and a gate of the twenty-fourth MOS transistor are connected, a drain of the twentieth MOS transistor, a drain of the twenty-first MOS transistor and a drain of the twenty-fourth MOS transistor are connected, a gate of the twenty-second MOS transistor and a gate of twenty-sixth MOS transistor are connected to a connecting terminal which is the output terminal of the dynamic comparator, a drain of the twenty-second MOS transistor, a drain of the twenty-third MOS transistor and a drain of the twenty-sixth MOS transistor are connected, a source of the twenty-fourth MOS transistor and a drain of the twenty-fifth MOS transistor are connected, and a source of the twenty-sixth MOS transistor and a drain of the twenty-seventh MOS transistor are connected.

* * * * *